(12) United States Patent
Hirano

(10) Patent No.: US 9,459,541 B2
(45) Date of Patent: Oct. 4, 2016

(54) SUBSTRATE PROCESSING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 231 days.

(21) Appl. No.: 14/192,960

(22) Filed: Feb. 28, 2014

(65) Prior Publication Data

US 2014/0253899 A1 Sep. 11, 2014

(30) Foreign Application Priority Data

Mar. 6, 2013 (JP) ................................ 2013-044719

(51) Int. Cl.
 *G03F 7/20* (2006.01)
 *G03F 9/00* (2006.01)
(52) U.S. Cl.
 CPC ........... *G03F 7/70783* (2013.01); *G03F 7/707* (2013.01); *G03F 9/7011* (2013.01)
(58) Field of Classification Search
 CPC ... G03F 7/707; G03F 7/70783; G03F 9/7011
 See application file for complete search history.

(56) References Cited

U.S. PATENT DOCUMENTS

| 6,973,370 B2 | 12/2005 | Ito et al. |
| 2003/0133762 A1 | 7/2003 | Yamamoto et al. |
| 2006/0169208 A1* | 8/2006 | Shinozaki et al. ............ 118/715 |
| 2012/0300188 A1* | 11/2012 | Butler et al. .................... 355/73 |

FOREIGN PATENT DOCUMENTS

| JP | 2001-284434 A | 10/2001 |
| JP | 2003-234392 A | 8/2003 |
| KR | 100901040 B1 | 6/2009 |
| KR | 101015778 B1 | 2/2011 |

OTHER PUBLICATIONS

Korean Office Action issued in counterpart application No. KR10-2014-0023936, dated Jan. 15, 2016.

* cited by examiner

*Primary Examiner* — Michelle M Iacoletti
(74) *Attorney, Agent, or Firm* — Rossi, Kimms & McDowell LLP

(57) ABSTRACT

The present invention provides a substrate processing apparatus for performing a process of reducing warpage of a substrate, comprising a substrate stage configured to hold the substrate, a pressing member including a portion formed to press a peripheral portion of the substrate against the substrate stage, an obtaining unit configured to obtain information indicating a shift between a center of a region where a pattern is formed on the substrate and a center of the substrate, and a controller configured to control relative positions of the substrate stage and the pressing member based on the information obtained by the obtaining unit, such that the portion of the pressing member presses the peripheral portion of the substrate.

18 Claims, 9 Drawing Sheets

SUBSTRATE PROCESSING APPARATUS, LITHOGRAPHY APPARATUS, AND METHOD OF MANUFACTURING ARTICLE

BACKGROUND OF THE INVENTION

1. Field of the Invention

The present invention relates to a substrate processing apparatus, lithography apparatus, and method of manufacturing an article.

2. Description of the Related Art

The multilayering of circuit patterns is advancing as the integration degree of semiconductor devices increases. When the multilayering of circuit patterns thus advances, circuit patterns are stacked on a substrate such as a wafer, so distortions produced during stacking accumulate and warp the substrate.

If the substrate thus warps, a substrate stage cannot normally hold the substrate when transferring a pattern to the substrate by a lithography apparatus. This poses problems that, for example, the transfer sequence stops, or it is impossible to accurately align the substrate and an original. Therefore, Japanese Patent Laid-Open Nos. 2001-284434 and 2003-234392 have disclosed a method of reducing the warpage of a substrate by pressing the peripheral portion of the substrate against the substrate stage by using a pressing member.

Recently, in order to align a substrate and original within a short time, a lithography apparatus performs pre-alignment for detecting the center of a pattern formation region on the substrate when placing the substrate on a substrate stage, thereby matching the center of the region with a reference point of the substrate stage. In this lithography apparatus, however, if a shift occurs between the center of the region and the center of the substrate, the peripheral portion of the substrate cannot be pressed against the substrate stage by a pressing member without taking account of this shift. As a consequence, it may become impossible to sufficiently reduce the warpage of the substrate.

SUMMARY OF THE INVENTION

The present invention provides a technique advantageous in reducing the warpage of a substrate placed on a substrate stage.

According to one aspect of the present invention, there is provided a substrate processing apparatus for performing a process of reducing warpage of a substrate, comprising: a substrate stage configured to hold the substrate; a pressing member including a portion formed to press a peripheral portion of the substrate against the substrate stage; an obtaining unit configured to obtain information indicating a shift between a center of a region where a pattern is formed on the substrate and a center of the substrate; and a controller configured to control relative positions of the substrate stage and the pressing member based on the information obtained by the obtaining unit, such that the portion of the pressing member presses the peripheral portion of the substrate.

Further features of the present invention will become apparent from the following description of exemplary embodiments with reference to the attached drawings.

DESCRIPTION OF THE EMBODIMENTS

Figure 1:
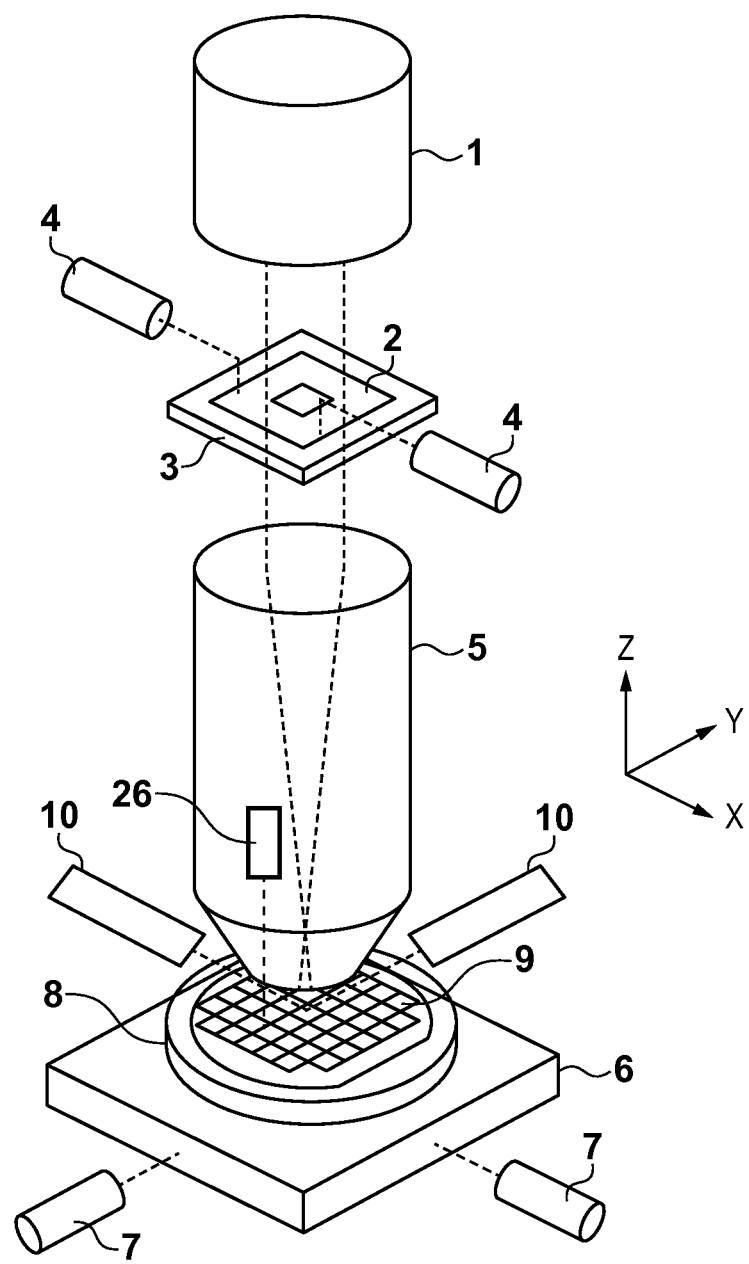
FIG. 1 is a schematic view showing the arrangement of an exposure apparatus of the first embodiment.

Exemplary embodiments of the present invention will be described below with reference to the accompanying drawings. Note that the same reference numerals denote the same members throughout the drawings, and a repetitive description thereof will not be given. Also, the present invention is applicable to a substrate processing apparatus that performs a process of reducing the warpage of a substrate held on a substrate stage. This substrate processing apparatus to which the present invention is applied can be applied to a lithography apparatus for forming a pattern on a substrate, for example, an exposure apparatus, drawing apparatus, or imprint apparatus. The following embodiments will be explained by taking an exposure apparatus for exposing a substrate as an example. In addition, a substrate chuck to be explained below is not limited to a vacuum holding chuck that vacuum-holds a substrate, and may also be an electrostatic holding chuck that electrostatically holds a substrate.

<First Embodiment>

Figure 2:
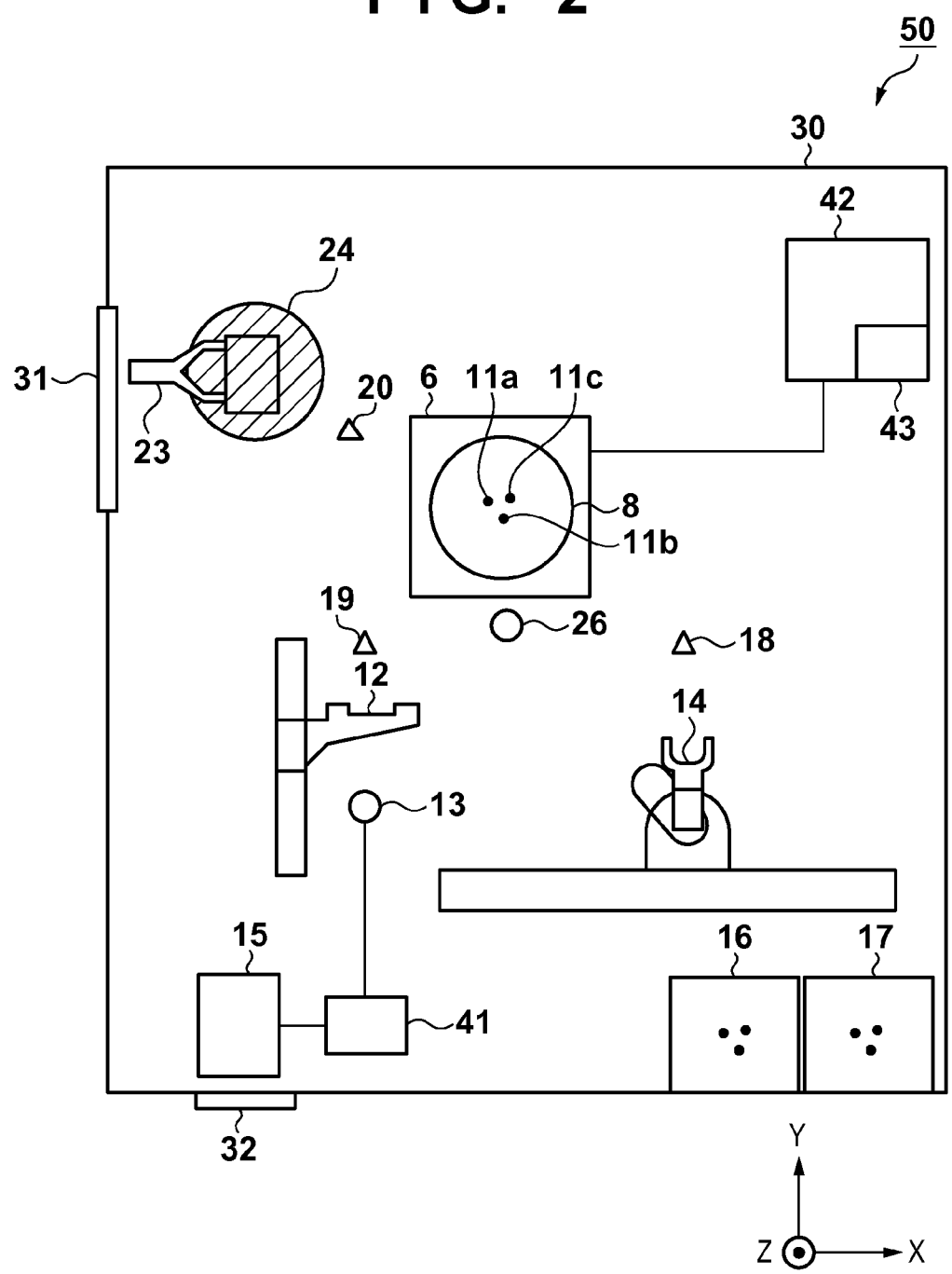
FIG. 2 is an exemplary view showing a substrate processing apparatus of the first embodiment.

An exposure apparatus 100 of the first embodiment of the present invention and a substrate processing apparatus 50 included in the exposure apparatus 100 will be explained with reference to FIGS. 1 and 2. First, the exposure apparatus 100 of the first embodiment will be explained with reference to FIG. 1. FIG. 1 is a schematic view showing the arrangement of the exposure apparatus 100 of the first embodiment. FIG. 1 does not show the substrate processing apparatus 50 to be described later. As shown in FIG. 1, the exposure apparatus 100 includes an illumination system 1 including a light source and shutter, a mask stage 3 for holding a mask 2 on which a circuit pattern is formed, a projection optical system (projection exposure lens) 5, and a substrate stage 6 for holding a wafer (substrate 9) via a substrate chuck 8. The substrate stage 6 is designed to be movable in the X and Y directions while the substrate 9 to be exposed is mounted on it. The exposure apparatus 100 also includes a mask position measurement device 4, laser interferometer 7, auto focus unit 10, alignment scope 26, and wafer Z driving mechanism (not shown). The mask position measurement device 4 measures the position of the mask 2 held on the mask stage 3. The laser interferometer 7 irradiates a reflection plate (not shown) formed on the substrate stage 6 with a laser beam, and detects the laser beam reflected by the reflection plate, thereby measuring the position of the substrate stage 6 from the distance between the substrate stage 6 and laser interferometer 7. The auto focus unit 10 irradiates the surface to be exposed of the substrate 9 with light, and detects the reflected light, thereby measuring a focusing position on the surface to be exposed of the substrate 9. The alignment scope 26 detects each of a plurality of marks (alignment marks) in a pattern formation region on the substrate, in order to perform alignment between a pattern formed on the mask 2 and a pattern formed on the substrate.

Next, the substrate processing apparatus 50 included in the exposure apparatus 100 will be explained with reference to FIG. 2. FIG. 2 is an exemplary view showing the substrate processing apparatus 50. The substrate processing apparatus 50 performs a process of transferring the substrate 9 and reducing the warpage of the substrate 9, a process of detecting a plurality of marks on the substrate, and a process of detecting the center of the substrate 9. FIG. 2 shows a chamber 30 including a door 31, the substrate stage 6 including the substrate chuck 8 and three pins 11a to 11c, a pre-alignment unit 13, a controller 15, an obtaining unit 41, and an absorption force controller 42 including an absorption force measurement unit 43. FIG. 2 also shows a substrate loading station 16, substrate unloading station 17, substrate transfer hand 14, substrate feed hand 12, and robot hand 23. A substrate collecting position 18, substrate supply position 19, and maintenance position 20 indicated by triangles in FIG. 2 show the positions of the substrate stage 6 at which respective corresponding processes are executed.

The chamber 30 maintains an exposure environment at a predetermined temperature and predetermined humidity. The substrate stage 6 vacuum-holds the substrate 9 below the projection optical system 5 via the substrate chuck 8. The absorption force controller 42 for controlling the absorption force when the substrate stage 6 holds the substrate 9 controls the holding of the substrate 9 by the substrate stage 6 (substrate chuck 8). The absorption force controller 42 includes the absorption force measurement unit 43 for measuring the absorption force when the substrate stage 6 holds the substrate 9. The three pins 11a to 11c change the distance between the substrate 9 and substrate chuck 8 so that the substrate transfer hand 14 can be inserted between the substrate 9 and substrate chuck 8 when transferring the substrate 9 to the substrate chuck 8. The substrate stage 6 can move the substrate 9, substrate chuck 8, and pins 11a to 11c together in the X and Y directions. An unexposed substrate 9 is externally loaded into the chamber 30 and placed on the substrate loading station 16. An exposed substrate 9 is placed on the substrate unloading station 17 and waits until it is unloaded outside the chamber 30. The pre-alignment unit 13 pre-aligns the substrate 9 before an exposure process. The controller 15 is a computer for controlling the exposure apparatus 100, electrically connected to a user interface 32, and designed to include a CPU and memory. The controller 15 may be configured by one or a plurality of computers.

The substrate transfer hand 14 transfers the substrate 9 loaded on the substrate loading station 16 to the pre-alignment unit 13. Also, the substrate transfer hand 14 receives an exposed substrate placed on the pins 11a to 11c in the substrate collecting position 18, and transfers the substrate to the substrate unloading station 17. The substrate feed hand 12 transfers the substrate 9 pre-aligned by the pre-alignment unit 13 to the substrate supply position 19, and transfers the substrate 9 onto the pins 11a to 11c protruding from the substrate chuck 8. In the first embodiment, the pins 11a to 11c are protruded from the substrate chuck 8 by vertically moving the substrate chuck 8 (the substrate stage 6) while the pins 11a to 11c are halted. However, the present invention is not limited to this. For example, the pins 11a to 11c may also be protruded from the substrate chuck 8 by vertically moving the pins 11a to 11c while the substrate chuck 8 is halted.

Figure 3:
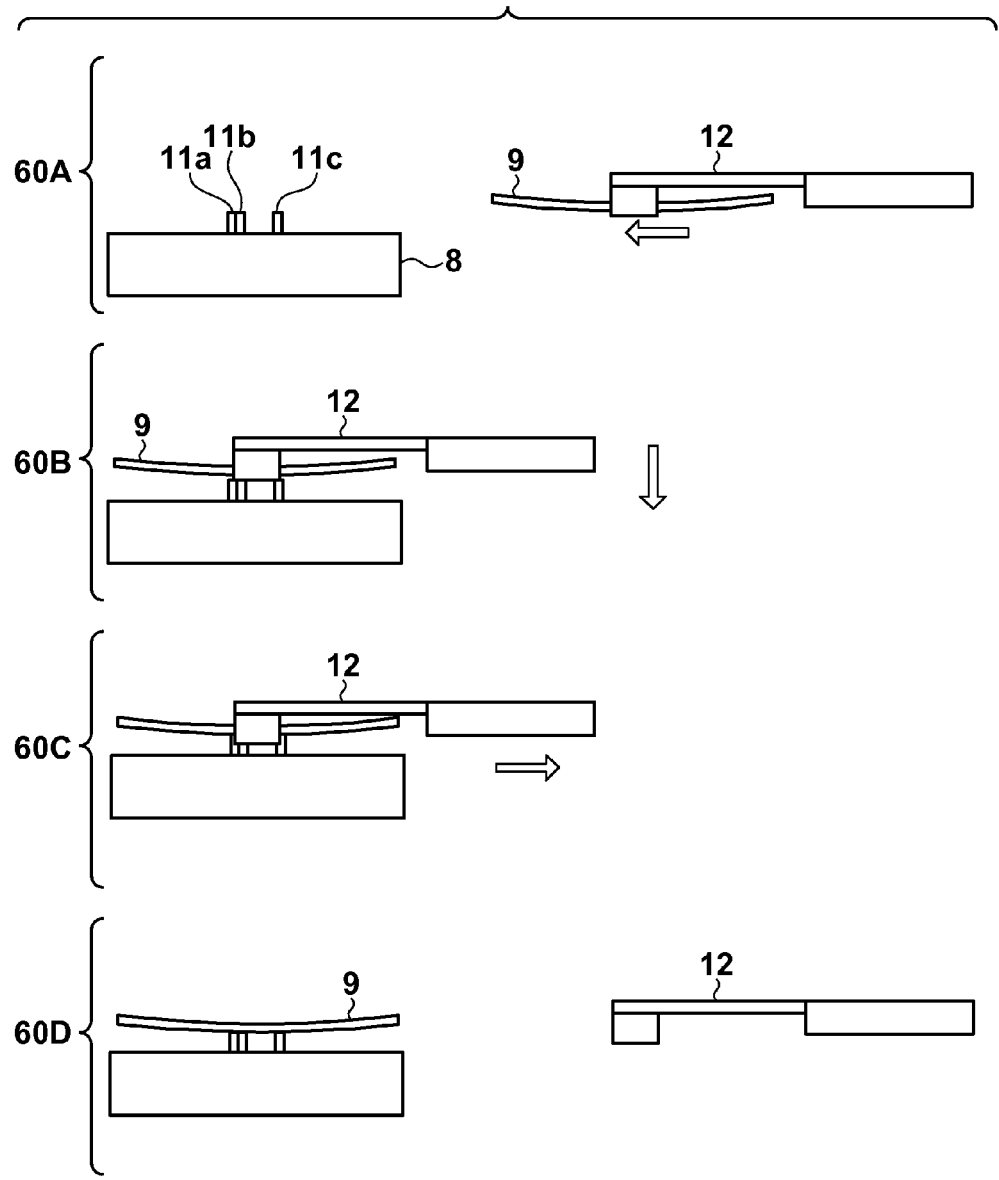
FIG. 3 is a view for explaining a process by which a substrate feed hand transfers a substrate to pins.

The process by which the substrate feed hand 12 transfers the substrate 9 to the pins 11a to 11c protruding from the substrate stage will be explained below with reference to FIG. 3. FIG. 3 is a view for explaining the process by which the substrate feed hand 12 transfers the substrate 9 to the pins 11a to 11c. 60A to 60D in FIG. 3 show the motions of the substrate feed hand 12 and pins 11a to 11c in time series. In 60A of FIG. 3, the controller 15 causes the substrate feed hand 12 to hold the substrate 9, and moves the substrate 9 to a position above the pins 11a to 11c protruding from the substrate stage 6. In this state, the substrate stage 6 is placed in the substrate supply position 19. In 60B of FIG. 3, the controller 15 lowers the substrate feed hand 12 holding the substrate 9, and places the substrate 9 on the pins 11a to 11c from the substrate feed hand 12. In 60C of FIG. 3, the controller 15 evacuates the substrate feed hand 12 after the substrate feed hand 12 has transferred the substrate 9 to the pins 11a to 11c. Consequently, the process by which the substrate feed hand 12 transfers the substrate 9 to the pins 11a to 11c is completed, and the substrate 9 is set on the pins 11a to 11c as indicated by 60D in FIG. 3.

Figure 4:
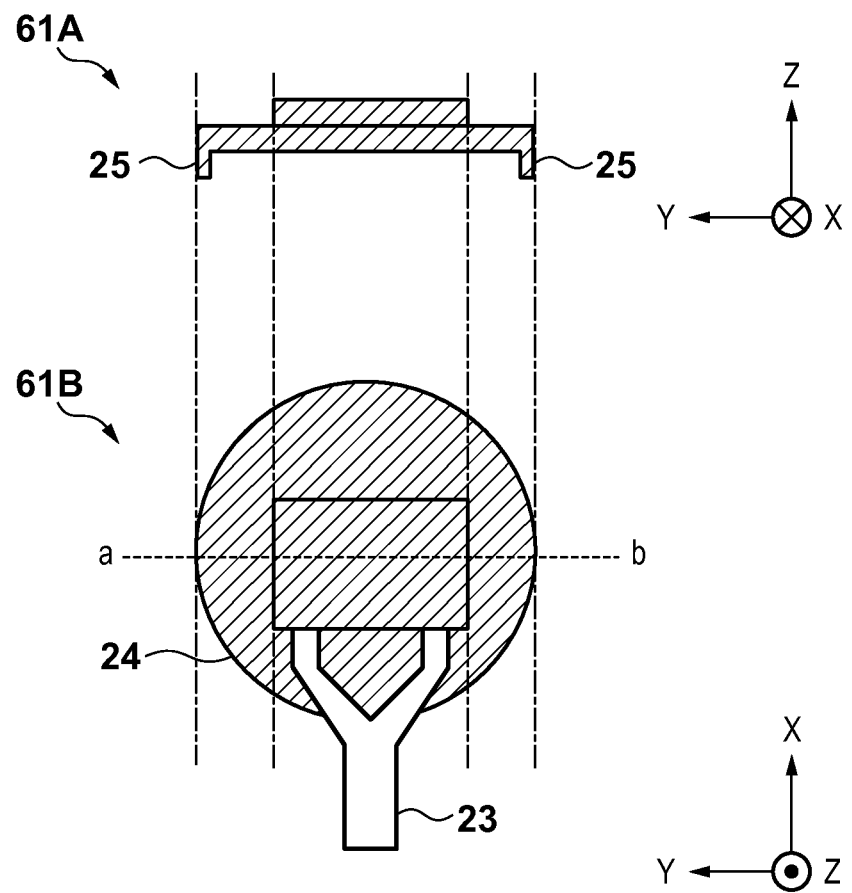
FIG. 4 is a view showing a pressing member.

If a holding error of the substrate 9 occurs in the substrate chuck 8, the robot hand 23 transfers a pressing member 24 for pressing the substrate 9 against the substrate stage 6 (the substrate chuck 8) and recovering the holding error of the substrate 9. The controller 15 determines a holding error of the substrate 9 in the substrate chuck 8 based on whether the absorption force (the force with which the substrate chuck holds the substrate) measured by the absorption force measurement unit 43 falls within an allowable range. If the absorption force measured by the absorption force measurement unit 43 falls within the allowable range, the controller 15 determines that no substrate holding error has occurred in the substrate chuck 8. On the other hand, if the absorption force falls outside the allowable range, the controller 15 determines that a substrate holding error has occurred in the substrate chuck 8. The pressing member 24 is a member for pressing the substrate 9 against the substrate stage 6 (the substrate chuck 8) so as to reduce the warpage of the substrate 9, and is moved by the robot hand 23. FIG. 4 is a view showing the pressing member 24. 61A in FIG. 4 is a sectional view (a sectional view taken along a dotted line a-b in 61B of FIG. 4) of the pressing member 24. 61B in FIG. 4 is a view showing the pressing member 24 from above. As shown in FIG. 4, the pressing member 24 has a portion 25 protruding in the −Z direction so as to press the peripheral portion of the substrate 9 against the substrate stage 6. The portion 25 is formed into a ring-like shape so as to be brought into contact with only the peripheral portion of the substrate 9, that is, so as not to be brought into contact with a region (to be referred to as a pattern region hereinafter) in which a pattern is formed on the substrate. The portion 25 of the pressing member 24 according to the first embodiment is formed into a ring-like shape, but is not limited to this shape. For example, the portion 25 may also be divided so as to be brought into contact with a plurality of portions of the peripheral portion of the substrate. Also, in the manufacture of a semiconductor device, the pattern region of the substrate 9 must be enlarged in order to improve the productivity (throughput). Therefore, it is necessary to reduce the region on the substrate with which the portion 25 of the pressing member 24 is to be brought into contact, so the pressing member 24 is so formed as to decrease the width of the portion 25 to be brought into contact with the substrate 9.

Figure 5A:
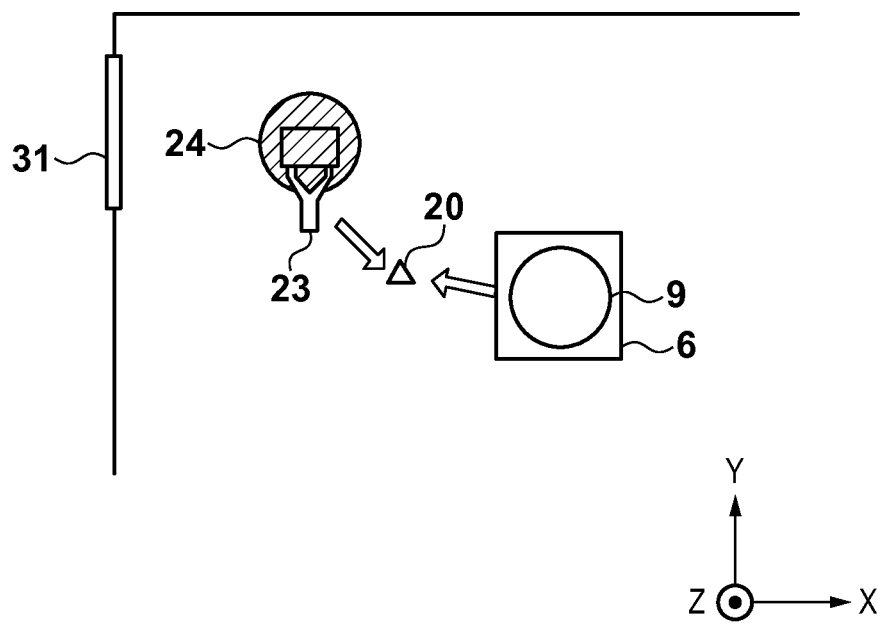
FIG. 5A is an exemplary view showing the positional relationship between the pressing member and a substrate stage when viewed from above.
Figure 5B:
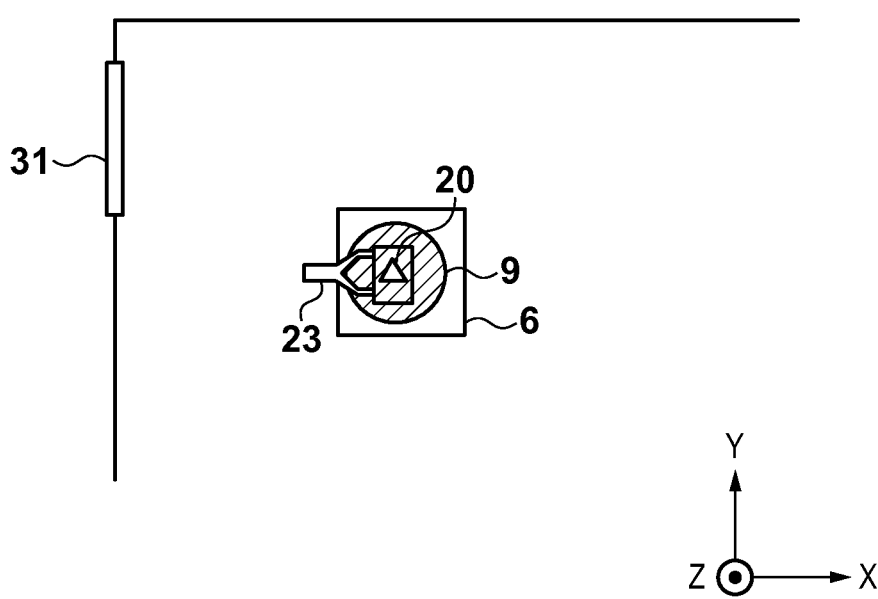
FIG. 5B is an exemplary view showing the positional relationship between the pressing member and substrate stage when viewed from above.

The process of reducing the warpage of the substrate 9 by the pressing member 24 will be explained below with reference to FIGS. 5A, 5B, and 6. FIGS. 5A and 5B are schematic views each showing, from above, the positional relationship between the pressing member 24 and substrate stage 6 when reducing the warpage of the substrate 9 placed on the substrate stage 6, and illustrate the motions of the pressing member 24 (the robot hand 23) and substrate stage 6 in time series. After the substrate 9 is placed on the substrate stage 6 as indicated by 60D in FIG. 3, the pressing member 24 and substrate stage 6 have the positional relationship shown in FIG. 5A. In this state, the controller 15 checks whether a holding error of the substrate 9 has occurred in the substrate chuck 8. If a holding error of the substrate 9 has occurred in the substrate chuck 8, the substrate stage 6 moves to the maintenance position 20, and the robot hand 23 moves the pressing member 24 to a position above the substrate stage 6 set in the maintenance position 20. In this state, the substrate stage 6 and pressing member 24 have the positional relationship shown in FIG. 5B, and the process of reducing the warpage of the substrate 9 is executed in this positional relationship.

Figure 6:
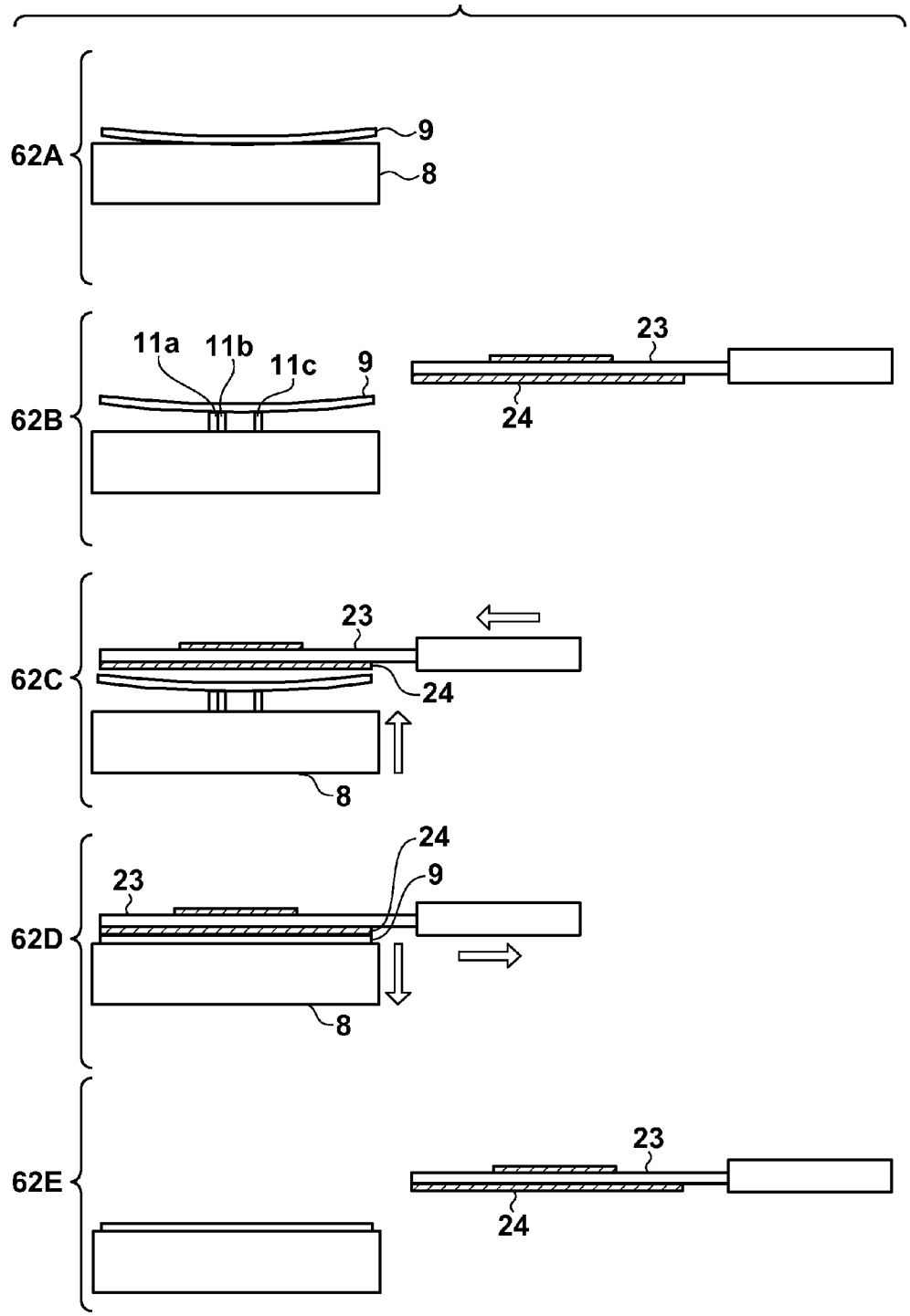
FIG. 6 is a view for explaining a process of reducing the warpage of a substrate.

FIG. 6 is a view for explaining the process of reducing the warpage of the substrate 9. 62A to 62E in FIG. 6 illustrate the motions of the substrate stage 6 (the pins 11a to 11c) and the pressing member 24 (the robot hand 23) in time series. The portion 25 of the pressing member 24 is not shown in FIG. 6. In 62A of FIG. 6, after the substrate 9 is set on the pins 11a to 11c as indicated by 60D in FIG. 3, the controller 15 causes the substrate chuck 8 to hold the substrate 9 by moving the substrate chuck 8 in the Z direction. In this state, the positional relationship between the substrate stage 6 and pressing member 24 is as shown in FIG. 5A, and the controller 15 causes the substrate chuck 8 to hold the substrate 9, and checks whether there is a holding error. In 62B of FIG. 6, if a holding error of the substrate 9 has occurred in the substrate chuck 8, the controller 15 moves the substrate stage 6 to the maintenance position 20, and protrudes the pins 11a to 11c from the substrate chuck 8, thereby releasing the substrate 9 from the substrate chuck 8. In 62C of FIG. 6, the controller 15 controls the robot hand 23 so as to move the pressing member 24 to a position above the substrate 9, and raises the substrate chuck 8. In this state, the positional relationship between the substrate stage 6 and pressing member 24 is as shown in FIG. 5B. In 62D of FIG. 6, the controller 15 raises the substrate chuck 8, and sandwiches the substrate 9 between the pressing member 24 and substrate chuck 8. In this state, the substrate chuck 8 is so controlled as to hold the substrate 9 by its entire surface. Accordingly, when the substrate 9 is sandwiched between the pressing member 24 and substrate chuck 8, the warpage of the substrate 9 can be kept reduced. In 62E of FIG. 6, the controller 15 lowers the substrate chuck 8, and controls the robot hand 23 so as to move the pressing member 24 to a waiting position. Consequently, it is possible to reduce the warpage of the substrate 9, and recover the holding error of the substrate 9 in the substrate chuck 8.

Recently, in order to align the substrate 9 and mask 2 within a short time, an exposure apparatus matches the center of the pattern formation region on the substrate 9 with the reference point (the center of the substrate chuck 8) of the substrate stage 6 when placing the substrate 9 on the substrate stage 6. In an exposure apparatus like this, however, the pressing member 24 generally presses the substrate 9 based on the reference point (the center of the substrate chuck 8) of the substrate stage 6, that is, such that the reference point of the substrate stage 6 matches the center of the pressing member 24. Therefore, if a shift occurs between the center of a pattern formation region (to be referred to as a pattern region hereinafter) on the substrate 9 and the center of the substrate 9, the pressing member 24 cannot press the peripheral portion of the substrate 9 against the substrate stage 6 without taking account of this shift. As a consequence, it may become impossible to sufficiently reduce the warpage of the substrate 9. In the exposure apparatus 100 of the first embodiment, therefore, the portion 25 of the pressing member 24 presses the peripheral portion of the substrate 9 against the substrate stage 6 by taking into account of the shift between the center of the pattern region and the center of the substrate 9. This makes it possible to effectively reduce the warpage of even the substrate 9 having the shift, and recover a holding error of the substrate 9 in the substrate chuck 8. The shift between the center of the pattern region and the center of the substrate 9 will be explained below with reference to FIGS. 7 and 8.

Figure 7:
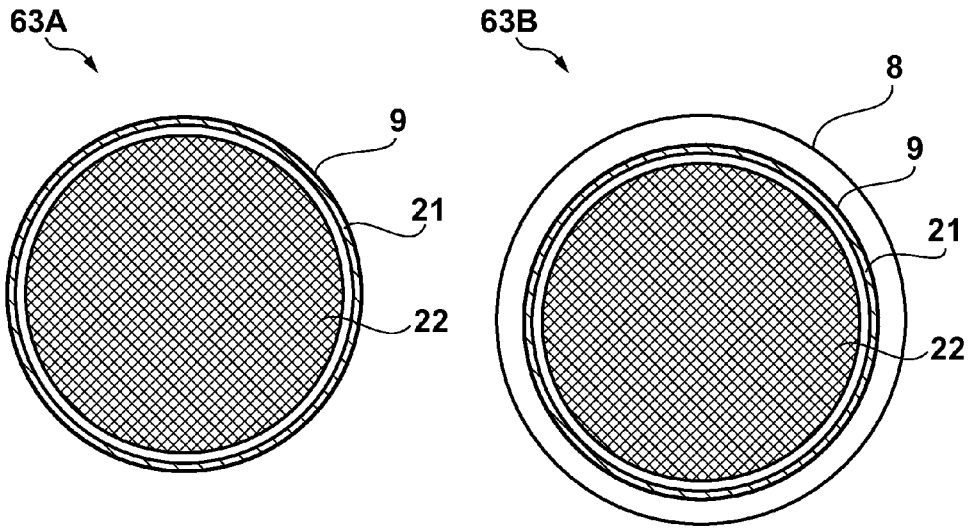
FIG. 7 is a view for explaining a shift between the center of a pattern region and the center of a substrate.

63A in FIG. 7 is a view showing, in the Z direction, the substrate 9 when the center of a pattern region 22 matches the center of the substrate 9, that is, the substrate 9 when no shift has occurred between the center of the pattern region 22 and the center of the substrate 9. A portion indicated by oblique lines along the outer edge of the substrate 9 is a peripheral portion 21 of the substrate 9. The warpage of the substrate 9 can effectively be reduced by pressing this portion against the substrate chuck 8 (the substrate stage 6) by the portion 25 of the pressing member 24. As described above, the exposure apparatus 100 matches the center of the pattern region 22 with the center of the substrate chuck 8 when placing the substrate 9 on the substrate stage 6 (the substrate chuck 8). When the substrate 9 indicated by 63A in FIG. 7 is placed on the substrate chuck 8, therefore, it is possible to match the center of the pattern region 22, the center of the substrate 9, and the center of the substrate chuck 8 as indicated by 63B in FIG. 7. In this case, even if the center of the substrate chuck 8 is used as a reference when pressing the substrate 9 by the pressing member 24, the portion 25 of the pressing member 24 can press the peripheral portion 21 of the substrate 9. However, a shift often occurs between the center of the pattern region 22 and the center of the substrate 9 due to various errors such as an apparatus error and alignment error, and the maximum shift sometimes reaches 2 mm.

Figure 8:
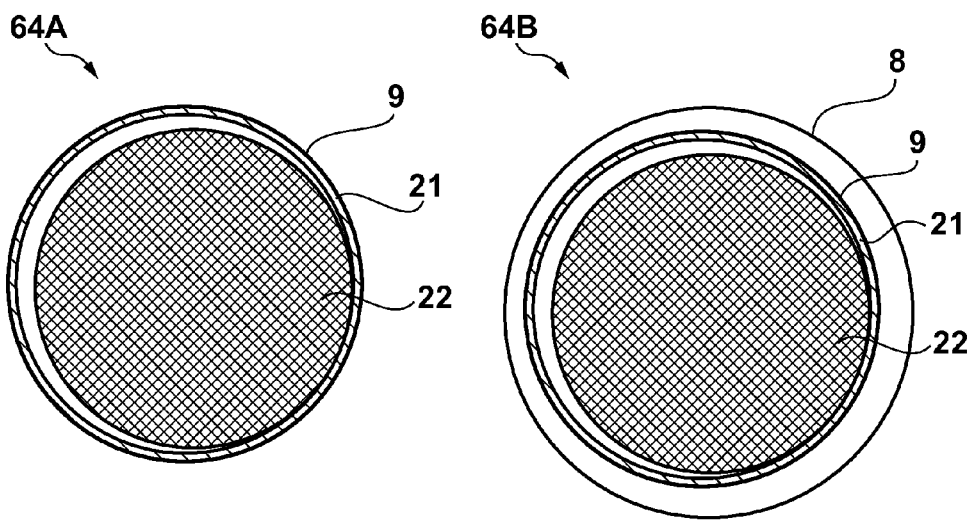
FIG. 8 is a view for explaining a shift between the center of a pattern region and the center of a substrate.
Figure 9:
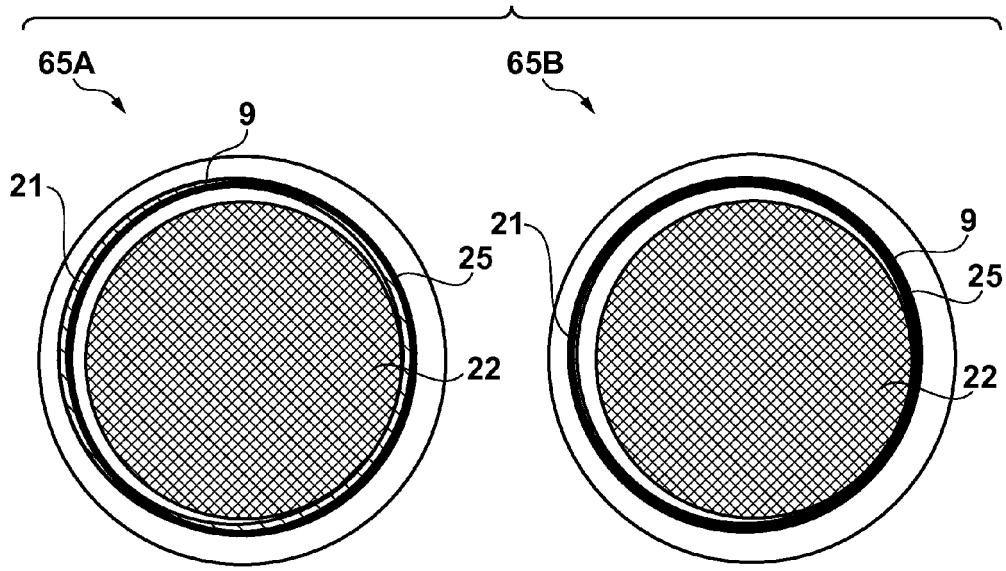
FIG. 9 is a view for explaining a shift between the center of a pattern region and the center of a substrate.

64A in FIG. 8 is a view showing, in the Z direction, the substrate 9 when the center of the pattern region 22 does not match the center of the substrate 9, that is, the substrate 9 when a shift has occurred between the center of the pattern region 22 and the center of the substrate 9. A portion indicated by oblique lines along the outer edge of the substrate 9 is the peripheral portion 21 of the substrate 9 as in FIG. 7, and the warpage of the substrate 9 can effectively be reduced by pressing this portion against the substrate chuck 8 (the substrate stage 6) by the portion 25 of the pressing member 24. As described above, the exposure apparatus 100 matches the center of the pattern region 22 with the center of the substrate chuck 8 when placing the substrate 9 on the substrate stage 6. When the substrate 9 shown in 64A of FIG. 8 is placed on the substrate chuck 8, therefore, the center of the pattern region 22 can be matched with the center of the substrate chuck 8, but the center of the substrate 9 cannot be matched with the center of the substrate chuck 8, as indicated by 64B in FIG. 8. In this case, if the center of the substrate chuck 8 is used as a reference when pressing the substrate 9 by the pressing member 24, the portion 25 of the pressing member 24 cannot press the peripheral portion 21 of the substrate 9, as indicated by 65A in FIG. 9. Consequently, it may become impossible to sufficiently reduce the warpage of the substrate 9. Accordingly, the exposure apparatus 100 of the first embodiment includes the obtaining unit 41 for obtaining information indicating a shift between the center of the pattern region 22 and the center of the substrate 9. Based on this information obtained by the obtaining unit 41, the exposure apparatus 100 causes the controller 15 to control the robot hand 23 so as to move the pressing member 24 by the shift amount. As indicated by 65B in FIG. 9, therefore, it is possible to press the peripheral portion 21 of the substrate 9 by the portion 25 of the pressing member 24, and effectively reduce the warpage of the substrate 9. In the exposure apparatus 100 of the first embodiment, the robot hand 23 moves the pressing member 24 by the shift amount obtained by the obtaining unit 41. However, the present invention is not limited to this, and the relative positions of the pressing member 24 and substrate 6 need only be changed. For example, it is also possible to move the substrate stage 6 or both the pressing member 24 and substrate stage 6 by the obtained shift amount.

Figure 10:
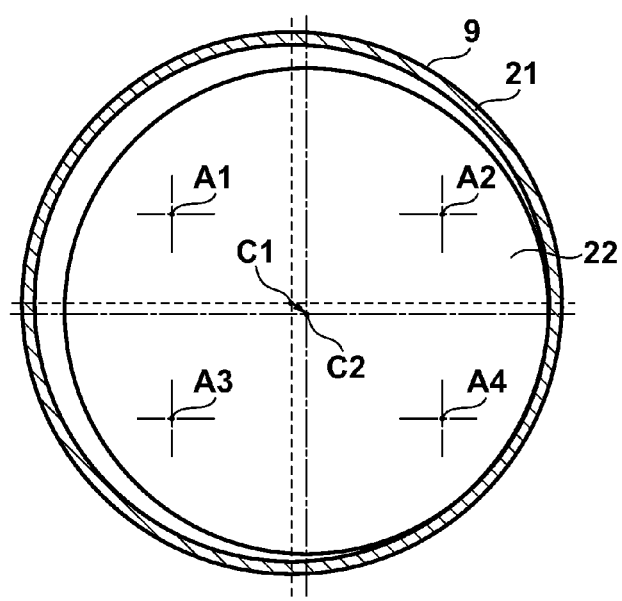
FIG. 10 is a view showing the positional relationship between a plurality of marks formed on a substrate when the center of a pattern region and the center of the substrate do not match.

The information obtained by the obtaining unit 41 and indicating a shift between the center of the pattern region 22 and the center of the substrate 9 will be explained below. The pre-alignment unit 13, for example, detects the center of the pattern region 22 and the center of the substrate 9. The pre-alignment unit 13 can include a measurement unit for measuring the center of the pattern region 22, and a detection unit for detecting the center of the substrate 9. The measurement unit measures the center of the pattern region 22 by optically detecting a plurality of marks (for example, pre-alignment marks) formed in the pattern region 22. FIG. 10 is a view showing the positional relationship between a plurality of marks arranged on the substrate 9 when the center of the pattern region 22 does not match the center of the substrate 9. As shown in FIG. 10, for example, the plurality of marks are formed in the pattern region 22, and so designed as to be symmetrically arranged with respect to the center of the pattern region 22. In the first embodiment, four marks A1 to A4 are formed in the pattern region 22, and so designed as to be symmetrically arranged with respect to the center of the pattern region 22. Accordingly, a center C2 of the pattern region 22 can be measured by detecting the plurality of marks (A1 to A4) and obtaining their positional relationship by the measurement unit. Also, the detection unit detects a center C1 of the substrate 9 by rotating the substrate 9. For example, the detection unit can detect the center C1 of the substrate 9 by rotating the substrate 9 such that the outer edge of the substrate 9 holds a predetermined position, and can also detect the center C1 of the substrate 9 by rotating the substrate 9 and detecting the outer edge of the substrate 9 by a laser beam or the like.

The obtaining unit 41 obtains the center C2 of the pattern region 22 from the measurement result from the measurement unit, and the center C1 of the substrate 9 from the detection result from the detection unit. Thus, the obtaining unit 41 can obtain the information indicating a shift between the center C2 of the pattern region 22 and the center C1 of the substrate 9. On the substrate 9 shown in FIG. 10, this shift contains shift components in the X and Y directions between the center C2 of the pattern region 22 and the center C1 of the substrate. In practice, however, the shift can also contain a rotational shift component called notch with respect to the center of the substrate 9. This notch can be corrected by moving the pressing member 24 or substrate stage 6 when pressing the substrate 9 by the pressing member 24, and can also be corrected when setting the substrate 9 on the substrate stage 6 in the substrate supply position 19. In the first embodiment, the obtaining unit 41 obtains the center of the pattern region 22 and the center of the substrate 9 from the measurement unit and detection unit, respectively, in the exposure apparatus 100 (the substrate processing apparatus 50). However, the present invention is not limited to this. For example, it is also possible to measure (detect) the center of the pattern region 22 and the center of the substrate 9 outside the exposure apparatus 100, and allow the obtaining unit 41 to obtain the results.

As described above, the exposure apparatus 100 of the first embodiment includes the obtaining unit 41 for obtaining the information indicating a shift between the center of the pattern region 22 and the center of the substrate 9. Based on the information obtained by the obtaining unit 41, the exposure apparatus 100 causes the controller 15 to control the robot hand 23 so as to move the pressing member 24 by the shift amount. This makes it possible to press the peripheral portion 21 of the substrate 9 by the portion 25 of the pressing member 24, and effectively reduce the warpage of the substrate 9.

A shift between the center of the pattern region 22 and the center of the substrate 9 is found to remain the same between a plurality of substrates manufactured under the same conditions. Therefore, information indicating the shift may also be obtained by the obtaining unit 41 as an exposure recipe parameter to be managed for each manufacturing process, and stored in the controller 15. When the information indicating the shift between the center of the pattern region 22 and the center of the substrate 9 is thus stored in the controller 15 for each manufacturing process, the same information can be used for exposure processes to be performed by using the same exposure recipe. As a consequence, the productivity (throughput) of the exposure apparatus 100 can be improved.

Figure 11:
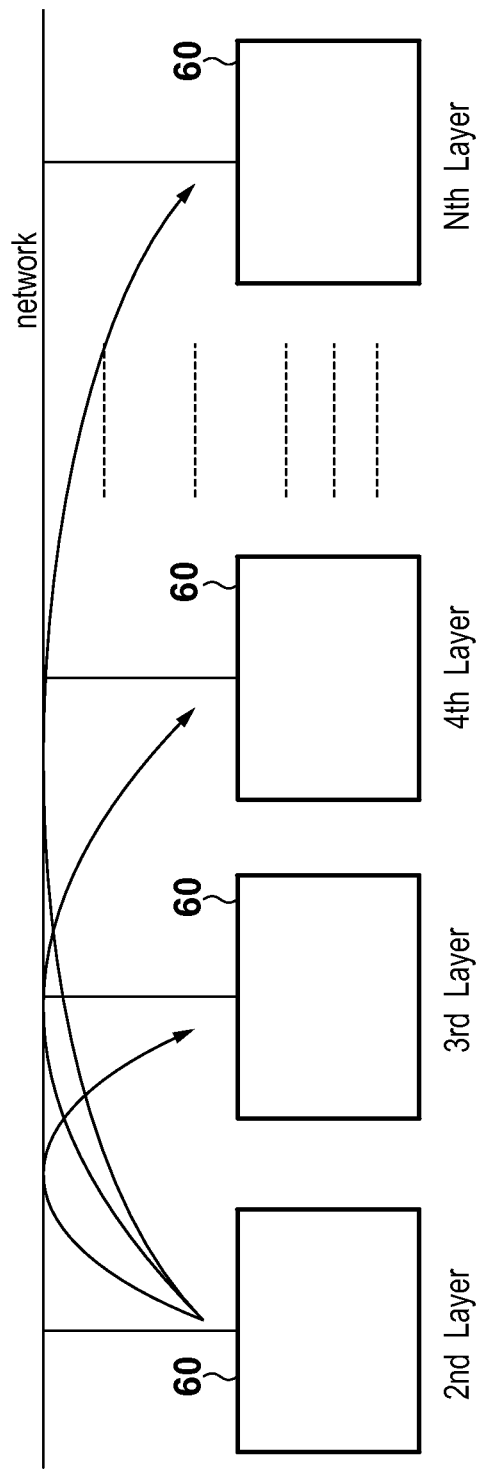
FIG. 11 is a view for explaining the way common information is used for a plurality of different layers.

Also, a shift between the center of the pattern region 22 and the center of the substrate 9 remains the same in different layers (patterns) overlaid and formed on the same substrate. That is, information indicating this shift is determined when a first layer is formed. When overlaying and forming a plurality of different layers (patterns) on a substrate, therefore, common information can be used when reducing the warpage of the substrate. FIG. 11 is a view for explaining the way common information is used for a plurality of different layers. As shown in FIG. 11, the controller 15 directly uses information 60, which is obtained by the obtaining unit 41 when a second layer (first pattern) is formed, when reducing the warpage of a substrate when a subsequent layer (second pattern) such as a third or fourth layer is to be formed. When reducing the warpage of the substrate when the subsequent layer (second pattern) is to be formed, the controller 15 controls the relative positions of the substrate stage 6 and pressing member 24 based on the information 60 such that the portion 25 of the pressing member 24 presses the peripheral portion of the substrate. The productivity (throughput) of the exposure apparatus 100 can be improved because the common information 60 can thus be used for a plurality of different layers to be formed on a substrate.

<Embodiment of Method of Manufacturing Article>

A method of manufacturing an article according to an embodiment of the present invention is suited to manufacture an article, for example, a microdevice such as a semiconductor device or an element having a microstructure. The method of manufacturing an article of this embodiment includes a step of forming a pattern by using the above-mentioned lithography apparatus (exposure apparatus) on a photosensitive agent applied on a substrate (a step of exposing the substrate), and a step of processing (developing) the substrate on which the pattern is formed in the above step. In addition, the manufacturing method includes other well-known steps (for example, oxidation, film formation, deposition, doping, planarization, etching, resist removal, dicing, bonding, and packaging). The method of manufacturing an article of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-044719 filed on Mar. 6, 2013, which is hereby incorporated by reference herein in its entirety.

What is claimed is:

1. A substrate processing apparatus for performing a process of reducing warpage of a substrate, comprising:
   a substrate stage configured to hold the substrate;
   a pressing member including a portion formed to press a peripheral portion of the substrate against the substrate stage;
   an obtaining unit configured to obtain information indicating a shift between a center of a region where a pattern was formed on the substrate and a center of the substrate; and
   a controller configured to control relative positions of the substrate stage and the pressing member based on the information obtained by the obtaining unit, such that the portion of the pressing member presses the peripheral portion of the substrate.

2. The apparatus according to claim 1, wherein the substrate is placed on the substrate stage such that the center of the region matches a reference point of the substrate stage.

3. The apparatus according to claim 1, further comprising a measurement unit configured to measure an absorption force when the substrate stage holds the substrate,
   wherein when the absorption force measured by the measurement unit falls outside an allowable range, the controller controls the relative positions of the substrate stage and the pressing member based on the information obtained by the obtaining unit, such that the portion of the pressing member presses the peripheral portion of the substrate.

4. The apparatus according to claim 1, further comprising a detection unit configured to detect the center of the substrate by rotating the substrate,
   wherein the obtaining unit obtains the information by using a detection result of the detection unit.

5. The apparatus according to claim 1, further comprising a measurement unit configured to measure the center of the region by detecting a plurality of marks formed in the region,
   wherein the obtaining unit obtains the information by using a measurement result of the measurement unit.

6. The apparatus according to claim 1, wherein the information is obtained by the obtaining unit when forming the pattern on the substrate, and stored in the controller.

7. The apparatus according to claim 1, wherein when forming a second pattern by overlaying it on a first pattern formed on the substrate, the controller is configured to control the relative positions of the substrate stage and the pressing member such that the portion of the pressing member presses the peripheral portion of the substrate, based on the information obtained by the obtaining unit when forming the first pattern on the substrate.

8. The apparatus according to claim 1, wherein the portion of the pressing member is formed into a ring-like shape to press the peripheral portion of the substrate.

9. The apparatus according to claim 1, wherein the portion of the pressing member is formed to press a plurality of portions of the peripheral portion of the substrate.

10. The apparatus according to claim 1, wherein the pattern is a pattern of a layer formed on the substrate.

11. A lithography apparatus for forming a pattern on a substrate, comprising a substrate processing apparatus for performing a process of reducing warpage of a substrate,
    wherein the substrate processing apparatus comprises:
      a substrate stage configured to hold the substrate;
      a pressing member including a portion formed to press a peripheral portion of the substrate against the substrate stage;
      an obtaining unit configured to obtain information indicating a shift between a center of a region where a pattern was formed on the substrate and a center of the substrate; and
      a controller configured to control relative positions of the substrate stage and the pressing member based on the information obtained by the obtaining unit, such that the portion of the pressing member presses the peripheral portion of the substrate, and
    wherein the warpage of the substrate is reduced by the substrate processing apparatus.

12. A method of manufacturing an article, the method comprising:
    forming a pattern on a substrate using a lithography apparatus which includes a substrate processing apparatus; and
    processing the substrate, on which the pattern has been formed, to manufacture the article,
    wherein the lithography apparatus comprises a substrate processing apparatus for performing a process of reducing warpage of a substrate,
    wherein the substrate processing apparatus includes:
      a substrate stage configured to hold the substrate;
      a pressing member including a portion formed to press a peripheral portion of the substrate against the substrate stage;
      an obtaining unit configured to obtain information indicating a shift between a center of a region where a pattern was formed on the substrate and a center of the substrate; and
      a controller configured to control relative positions of the substrate stage and the pressing member based on the information obtained by the obtaining unit, such that the portion of the pressing member presses the peripheral portion of the substrate, and
    wherein the warpage of the substrate is reduced by the substrate processing apparatus.

13. A substrate processing apparatus for performing a process of reducing warpage of a substrate, comprising:

a stage configured to hold the substrate;

a pressing unit including a contact portion which should be brought into contact with a peripheral portion of the substrate, and configured to press the substrate against the stage by the contact portion;

an obtaining unit configured to obtain information indicating a shift between a center of the substrate and a center of a pattern region where patterns were formed on the substrate; and a controller configured to control a pressing of the substrate by the pressing unit, wherein the substrate is placed on the stage such that the center of the pattern region matches a reference point of the stage, and wherein the controller is configured to control the pressing of the substrate by the pressing unit, based on a position shifted from the reference point by the shift obtained by the obtaining unit, such that the contact portion is brought into contact with the peripheral portion.

14. The apparatus according to claim 13, further comprising a measurement unit that measures the center of the pattern region by detecting a plurality of marks provided in the patterns.

15. The apparatus according to claim 13, wherein the controller is configured to control the pressing of the substrate, such that a center of the contact portion shifts from the reference point by the shift.

16. The apparatus according to claim 13, further comprising a measurement unit configured to measure an absorption force when the substrate stage holds the substrate, wherein when the absorption force measured by the measurement unit falls outside an allowable range, the controller controls the relative positions of the substrate stage and the pressing member based on the information obtained by the obtaining unit, such that the portion of the pressing member presses the peripheral portion of the substrate.

17. The apparatus according to claim 13, wherein the patterns are included in one layer formed on the substrate.

18. The apparatus according to claim 13, wherein the peripheral portion includes an outer edge of substrate.

* * * * *